(12) United States Patent
Lee et al.

(10) Patent No.: US 8,872,041 B2
(45) Date of Patent: Oct. 28, 2014

(54) MULTILAYER LAMINATE PACKAGE AND METHOD OF MANUFACTURING THE SAME

(75) Inventors: Baik-Woo Lee, Gwangmyeong-si (KR); Ji-Hyuk Lim, Suwon-si (KR); Seong-Woon Booh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 647 days.

(21) Appl. No.: 13/039,691

(22) Filed: Mar. 3, 2011

(65) Prior Publication Data
US 2012/0024583 A1 Feb. 2, 2012

(30) Foreign Application Priority Data
Jul. 30, 2010 (KR) .................. 10-2010-0074321

(51) Int. Cl.
*H05K 1/16* (2006.01)
*H05K 7/00* (2006.01)
*H05K 7/02* (2006.01)
*H05K 1/18* (2006.01)
*H05K 3/46* (2006.01)

(52) U.S. Cl.
CPC ................ *H05K 1/186* (2013.01); *H05K 3/462* (2013.01); *H01L 2224/16225* (2013.01)
USPC ........... 174/260; 174/250; 174/261; 361/761; 361/764; 29/832; 29/852

(58) Field of Classification Search
USPC ......... 174/250, 256, 257, 258, 259, 260, 261, 174/262; 361/761, 762, 764, 783; 29/832, 29/825, 846, 852
See application file for complete search history.

(56) References Cited

U.S. PATENT DOCUMENTS

| 5,111,278 | A | 5/1992 | Eichelberger | |
|---|---|---|---|---|
| 5,353,498 | A | 10/1994 | Fillion et al. | |
| 5,906,042 | A * | 5/1999 | Lan et al. | 29/852 |
| 6,734,534 | B1 | 5/2004 | Vu et al. | |
| 6,806,563 | B2 * | 10/2004 | Libous et al. | 257/691 |
| 6,972,964 | B2 * | 12/2005 | Ho et al. | 361/761 |
| 7,639,473 | B2 * | 12/2009 | Hsu et al. | 361/260 |
| 7,705,446 | B2 * | 4/2010 | Chia et al. | 257/703 |
| 7,738,256 | B2 * | 6/2010 | Sawatari et al. | 361/761 |
| 8,130,507 | B2 * | 3/2012 | Origuchi et al. | 361/760 |
| 8,400,776 | B2 * | 3/2013 | Sahara et al. | 361/765 |
| 2007/0025092 | A1 | 2/2007 | Lee et al. | |
| 2008/0049405 | A1 | 2/2008 | Sahara et al. | |
| 2008/0142951 | A1 * | 6/2008 | Hsu et al. | 257/700 |

FOREIGN PATENT DOCUMENTS

| JP | 2005-032739 A | 2/2005 |
|---|---|---|
| JP | 2007-266196 A | 10/2007 |
| JP | 2009-267149 A | 11/2009 |
| KR | 10-2008-0011106 | 1/2008 |

* cited by examiner

*Primary Examiner* — Angel R Estrada
*Assistant Examiner* — Dimary Lopez Cruz
(74) *Attorney, Agent, or Firm* — Sughrue Mion, PLLC

(57) ABSTRACT

A multilayer laminate package and a method of manufacturing the same are provided. The multilayer laminate package includes a cavity layer, a non-cavity layer, an electronic component, and a metalized blind via. The cavity layer includes a first adhesive layer and two first circuit layers, which are stacked with the first adhesive layer between, and an opening. The non-cavity layer includes a second adhesive layer and a second circuit layer. The non-cavity layer is bonded to the cavity layer with the second adhesive layer so as to close one side of the opening. The electronic component is mounted in the opening and is electrically connected to the non-cavity layer exposed through the opening. The metalized blind via electrically connects the non-cavity layer to one of the circuit layers of the cavity layer.

23 Claims, 18 Drawing Sheets

MULTILAYER LAMINATE PACKAGE AND METHOD OF MANUFACTURING THE SAME

CROSS-REFERENCE TO RELATED APPLICATION(S)

This application claims priority under 35 U.S.C. §119(a) of Korean Patent Application No. 10-2010-0074321, filed on Jul. 30, 2010, in the Korean Intellectual Property Office, the entire disclosure of which is incorporated by reference herein for all purposes.

BACKGROUND

1. Field

The following description relates to packaging technology for electronic components, and particularly, to embedded package technology for electronic components.

2. Description of the Related Art

As the performance of information technology (IT) devices is improved, mobile IT devices are becoming lightweighted, thin and small. Further, with the integration of various types of modules into a single electronic device becoming widespread, embedded package technology, which is capable of embedding various electronic components (such as an integrated circuit (IC) chip, a capacitor, a resistor, an inductor, an antenna, a micro-electro-mechanical-systems (MEMS) device, and the like) into a system substrate and contributing to the reduction of the size, thickness and weight of IT devices, has been developed.

The embedded package technology is characterized by embedding at least some electronic components in a system substrate, whereas surface mount technology (SMT) is characterized by mounting electronic components on the top surface of a system substrate. Printed circuit boards (PCB) or multilayer PCBs may be suitable for use in the embedded package technology as system substrates. As compared to the SMT, the embedded package technology can increase the packaging density for electronic components, reduce the length of the connections between electronic components and thus improve the reliability of the connection between the electronic components, and reduce the thickness of a whole package.

The embedded package technology, which uses multilayer PCBs, can be classified into 'during lamination' embedding and 'after lamination' embedding. The 'during lamination' embedding technique, which is characterized by embedding electronic components during the lamination of the layers of a core layer and/or a build-up layer of a multilayer laminate package, can provide excellent electrical properties, but fails to ensure a high yield of electronic devices and reworkability for faulty electronic components. On the other hand, the 'after lamination' embedding technique, which is characterized by embedding electronic components after the lamination of the layers of a core layer and/or a build-up layer of a multilayer laminate package, can provide a high yield of electronic devices and high reworkability, but can be responsible for poor electrical properties, which causes disadvantages given that it is required to ensure excellent electrical properties between the layers of a core layer or a build-up layer of a multilayer laminate package and between the core layer and the build-up layer.

SUMMARY

The following description relates to a multilayer laminate package and a method of manufacturing the same, which can guarantee high reworkability and yield.

The following description also relates to a multilayer laminate package and a method of manufacturing the same, which can make nearly all types of electronic components embeddable and contribute to the reduction of the weight, thickness and size of information technology (IT) devices and the improvement of the performance of IT devices.

According to an aspect of one or more exemplary embodiments, there is provided a multilayer laminate package including a cavity layer comprising a first adhesive layer, two first circuit layers, which are stacked with the first adhesive layer interposed therebetween, and at least one first opening, which is formed through the cavity layer; a first non-cavity layer comprising a second adhesive layer and a second circuit layer, the first non-cavity layer being bonded to a surface of the cavity layer with the second adhesive layer interposed therebetween so as to close one side of the at least one first opening; a first electronic component mounted in the first opening and electrically connected to a portion of the second circuit layer of the first non-cavity layer exposed through the first opening; and a first metalized blind via that is formed through the first non-cavity layer and that electrically connects one of the two first circuit layers of the cavity layer and the second circuit layer of the first non-cavity layer.

According to another aspect of one or more exemplary embodiments, there is provided a method of manufacturing a multilayer laminate package, the method including preparing a cavity layer including a first adhesive layer, two first circuit layers, which are stacked with the first adhesive layer interposed therebetween, and an opening, which is formed through the first circuit layers and the first adhesive layer; preparing a first non-cavity layer including a second circuit layer, which includes a first wiring layer, at least a portion of which is formed at a location thereon corresponding to the location of the opening; bonding the first non-cavity layer to a surface of the cavity layer with a second adhesive layer interposed therebetween such that the first non-cavity layer closes one side of the opening and the at least a portion of the first wiring layer is arranged at the location corresponding to the location of the opening; mounting a first electronic component at the location on the first non-cavity layer corresponding to the location of the opening such that the first electronic component can be electrically connected to the first wiring layer; and forming a first metalized blind via through the second circuit layer and the second adhesive layer, the first metalized blind via electrically connecting one of the first circuit layers of the cavity layer and the second circuit layer.

According to an aspect of one or more exemplary embodiments, there is provided a multilayer laminate package including a cavity layer comprising a first adhesive layer, a plurality of first circuit layers, and at least one first adhesive layer, the at least one first adhesive layer bonding together the first circuit layers so as to form a stack having a height; an opening which is formed in the cavity layer so as to penetrate through the stack of first circuit layers; a first non-cavity layer comprising a second adhesive layer and a second circuit layer, the first non-cavity layer being bonded to a surface of the cavity layer by the second adhesive layer so as to close one side of the opening and such that a portion of the second circuit layer is exposed through the opening; a first electronic component that has a height less than the height of the stack and is mounted in the opening and on the first non-cavity layer, and that is electrically connected to the portion of the second circuit layer exposed through the first opening; and a metalized blind via that is formed through the first non-cavity layer and electrically connects the second circuit layer to one of the first circuit layers

Figure 1:
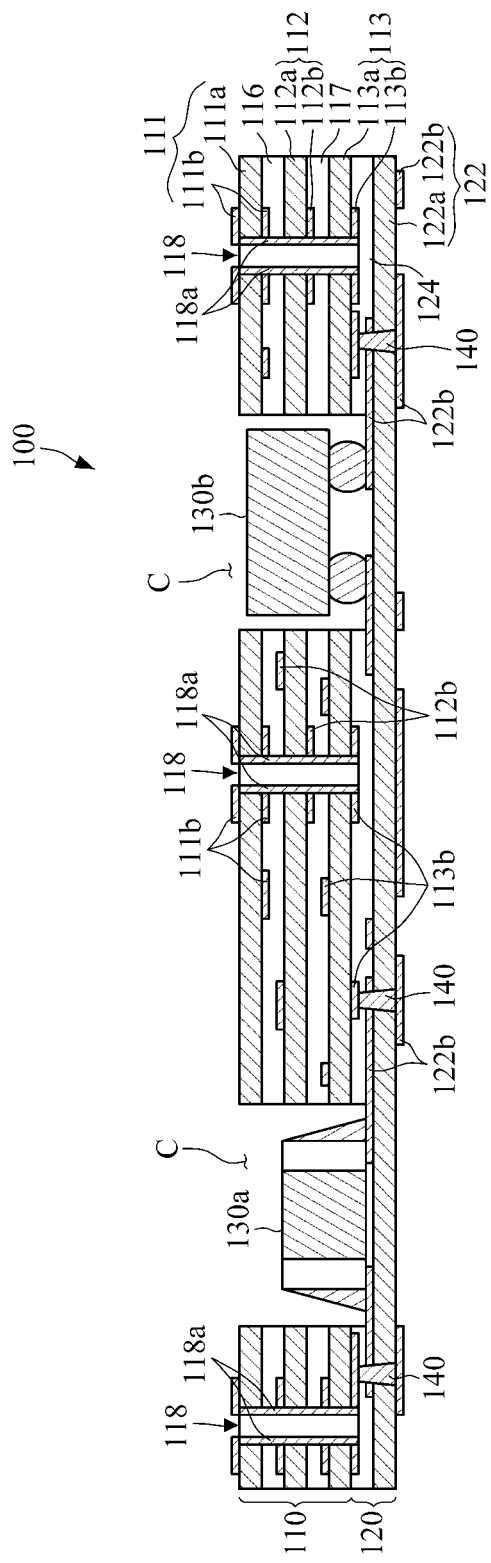
FIG. 1 is a cross-sectional view of an example of a multilayer laminate package according to an exemplary embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Multilayer laminate packages according to exemplary embodiments can be suitable for use not only in information technology (IT) devices (particularly, mobile IT devices such as a mobile phone) but also in bio-healthcare electronic devices and wearable electronic devices as a system integration package technology. For example, the multilayer laminate packages according to exemplary embodiments can be applied to mobile devices (such as mobile phones, including smart phones, personal digital assistants (PDAs), or portable multimedia players (PMPs)), portable computers (such as laptop computers or tablet computers), portable electronic devices (such as digital cameras or digital camcorders), connected health monitoring devices (such as heart disease bandage sensors) which can monitor the health conditions of an individual by being bonded onto the body of the individual, and implant devices which can be implanted into a limited space such as the body of an individual. The multilayer laminate packages according to exemplary embodiments can also be applied to portable electronic devices into which a variety of functions are integrated and non-portable electronic devices which can benefit from being compact in size.

FIG. 1 is a cross-sectional view of an example of a multilayer laminate package 100 according to an exemplary embodiment. Referring to FIG. 1, the multilayer laminate package 100 may include a cavity layer 110 having one or more openings or cavities formed therein, a non-cavity layer 120 bonded to the bottom surface of the cavity layer 110, one or more first electronic components 130a and 130b (hereinafter collectively referred to as the first electronic components 130), one or more metalized blind vias 140. The size and thickness of each of the elements of the multilayer laminate package 100 shown in FIG. 1 may be exaggerated for clarity, and the pattern of wiring in the multilayer laminate package 100 and the number and positions of elements (such as cavities, plated through holes (PTHs), metalized blind vias) in the multilayer laminate package 100 may be arbitrary.

The cavity layer 110 may include two or more circuit layers (i.e., first, second and third circuit layers 111, 112 and 113) which are stacked with one or more adhesive layers (i.e., first and second adhesive layers 116 and 117) interposed therebetween. The cavity layer 110 is illustrated in FIG. 1 as having three circuit layers, but the present inventive concept is not restricted to this. That is, the number of circuit layers in the cavity layer 110 may vary according to the number and size of the first electronic components 130 embedded in the cavity layer 110 and the pattern of wiring in the cavity layer 110. The first and second adhesive layers 116 and 117 are illustrated in FIG. 1 as having a single-layer structure, but the present inventive concept is not restricted to this. That is, the first and second adhesive layers 116 and 117 may both have a multilayer structure.

The first, second and third circuit layers 111 through 113 may include first, second and third insulating films 111a, 112a and 113a, respectively, and first, second and third wiring layers 111b, 112b and 113b, respectively, which have a predetermined pattern and are formed on one or both surfaces of their respective insulating films. The first, second and third insulating films 111a, 112a and 113a may be formed of a prepreg prepared by impregnating a base substrate formed of paper with an uncured material such as glass cloth, an organic fiber non-woven fabric such as an arimide resin, an epoxy resin, a polyimide resin, a bismaleimides resin, or a phenol resin and curing the base substrate, but the present inventive concept is not restricted to this. The first, second and third insulating films 111a, 112a and 113a may be formed to such a thickness that the first, second and third wiring layers 111b, 112b and 113b can be properly insulated from one another, and that crosstalk that may be generated between the first, second and third wiring layers 111b, 112b and 113b can be prevented. More specifically, the thickness of the first, second and third insulating films 111a, 112a and 113a may be determined in consideration of the height of the first electronic components 130, which are embedded in the cavity layer 110.

The first, second and third wiring layers 111b, 112b and 113b may be formed of a copper foil with a predetermined thickness through patterning using an etching process (e.g., photolithography). However, the first, second and third wiring layers 111b, 112b and 113b need not necessarily be formed of copper. That is, the first, second and third wiring layers 111b, 112b and 113b may be formed of various conductive materials with excellent electrical properties, other than copper. The shape and locations of the first, second and third wiring layers 111b, 112b and 113b shown in FIG. 1 are exemplary. However, the first, second and third wiring layers 111b, 112b and 113b, which are electrically connected to one another through a plurality of plated through-holes 118, may be formed in locations where the first, second and third wiring layers 111b, 112b and 113b can correspond to one another.

The first adhesive layer 116, which firmly attaches the first and second circuit layers 111 and 112 together, and the second adhesive layer 117, which firmly attaches the second and third circuit layers 112 and 113 together, may each be formed of a bonding sheet. The first and second adhesive layers 116 and 117 may also each be formed of an insulating material. There is no particular restriction on the type of material used to form the first and second adhesive layers 116 and 117. For example, the first and second adhesive layers 116 and 117, like the first, second and third insulating films 111a, 112a and 113a, may be formed of a prepreg prepared by impregnating a base substrate formed of paper with a material such as glass cloth, an organic fiber non-woven fabric such as an arimide resin, an epoxy resin, a polyimide resin, a bismaleimides resin, or a phenol resin and curing the base substrate.

In short, the cavity layer 110 may include at least two circuit layers and at least one adhesive layer. The number of circuit layers in the cavity layer 110, the thickness of the circuit layers and/or the thickness of the adhesive layer(s) in the cavity layer 110 may be determined based on the height of the first electronic components 130 embedded in the cavity layer 110. According to this exemplary embodiment, the thickness and size of a whole multilayer laminate package into which various electronic components that are difficult to miniaturize, for example, passive devices such as MEMS devices or antennas, are incorporated can be reduced by embedding the electronic components in a cavity layer. In addition, active devices that can be made thin, for example, semiconductor chips, can be easily embedded in a cavity layer without a requirement of thinning or grinding.

The first, second and third wiring layers 111b, 112b, and 113b, which are formed on one or both surfaces of their insulating films, may be electrically connected to one another through the plated through holes 118. The plated through holes 118 may be formed through the cavity layer 110, and a conductive metallic layer 118a may be formed on the inside of the plated through holes 118. The conductive metallic layer 118a may be formed by forming through holes in the cavity layer 110, exposing only the inside of the through holes and plating the inside of the through holes with a conductive metal. The cavity layer 110 is illustrated in FIG. 1 as having three plated through holes, but the present inventive concept is not restricted to this. The number and locations of the plated through holes 118 may vary.

The cavity layer 110 may have one or more openings or cavities C formed therethrough. Since the non-cavity layer 120 is bonded to the bottom surface of the cavity layer 110, the cavities C are blocked by the non-cavity layer 120 and open only on the side opposite the non-cavity layer 120.

The size and depth of the cavities C may be determined by the size and height of the first electronic components 130, which are embedded in the cavity layer 110. Given that the thickness of passive devices such as resistors, inductors, or capacitors is generally about 200 μm, and that MEMS devices or antennas are generally thicker than other passive devices, the cavities C may be formed to such a thickness that even relatively-thick electronic components can be properly embedded therein. More specifically, the height of the cavities C may be greater than the height of the first electronic components 130 in order for the first electronic components 130 to be properly embedded in the cavities C and to be properly electrically connected to the top surface of the non-cavity layer 120.

A wiring layer 122b of the non-cavity layer 120, which is electrically connected to the first electronic components 130, may be exposed in the cavities C. However, if the first electronic components 130 are embedded in the cavities C such that they can be electrically connected to the first, second and third wiring layers 111b, 112b and 113b of the cavity layer 110, the wiring layer 122b may not be exposed below the cavities C.

The first wiring layer 111b may be formed on both the top and bottom surfaces of the first circuit layer 111, and the third wiring layer 113c may be formed on both the top and bottom surfaces of the third circuit layer 113. Portions of the first wiring layer 111b at the top of the first circuit layer 111 and portions of the third wiring layer 113b at the bottom surface of the third circuit layer 113 may serve as paths for transmitting power and/or signals for the whole multilayer laminate package 100. Other portions of the first wiring layer 111b at the top of the first circuit layer 111 may serve as connectors for electronic components mounted on the first cavity layer 111 or for another non-cavity layer (not shown), and other portions of the third wiring layer 113b at the bottom surface of the third circuit layer 113 may serve as a connector for the non-cavity layer 120, which is bonded to the bottom surface of the third circuit layer 113.

Portions of the top surface of the first circuit layer 111 not covered by the first wiring layer 111b and portions of the bottom surface of the third circuit layer 113 not covered by the third wiring layer 113b may be coated with a passivation layer (not shown) such as a solder resist layer.

The non-cavity layer 120 may include an adhesive layer 124 and a circuit layer 122, which is bonded to the bottom surface of the cavity layer 110 with the adhesive layer 124 interposed therebetween. The circuit layer 122 may include an insulating film 122a and the wiring layer 122b, which has a pattern and is formed on one or both surfaces of the insulating film 122a. The circuit layer 122 may perform various functions such as transmitting signals, transmitting power and/or electrically connecting the first electronic components 130. The non-cavity layer 120 is illustrated in FIG. 1 as having only one circuit layer, but the present inventive concept is not restricted to this. That is, the non-cavity layer 120 may include two or more circuit layers bonded to one another with an adhesive layer interposed therebetween. The above descriptions of the first, second and third insulating films 111a, 112a and 113a of the cavity layer 110 can directly apply to the insulating film 122a of the non-cavity layer, the above descriptions of the first, second and third wiring layers 111b, 112b and 113b of the cavity layer 110 can directly apply to the wiring layer 122b of the non-cavity layer 120, and the above descriptions of the first and second adhesive layers 116 and 117 of the cavity layer 110 can directly apply to the adhesive layer 124 of the non-cavity layer 120. Thus, detailed descriptions of the insulating film 122a, the wiring layer 122b and the adhesive layer 124 of the non-cavity layer will be omitted.

The first electronic components 130 may be disposed in the cavities C of the cavity layer 110. The first electronic components 130 may be mounted on the non-cavity layer 120. Examples of the first electronic components 130 include, but are not restricted to, active devices such as silicon (Si) semiconductor chips, gallium arsenide (GaAs) semiconductor chips, indium antimonide (InSb) semiconductor chips and passive devices such as capacitors, resistors, inductors, MEMS devices, sensors, antennas, switches, filters, connectors, and the like. There are no particular restrictions on the size and thickness of the first electronic components 130, and thus, even electronic components that are difficult to miniaturize can be disposed in the cavities C.

The first electronic components 130 may be mounted on the non-cavity layer 120, and may be electrically connected to portions of the wiring layer 122b of the non-cavity layer 120 exposed through the cavities C. The first electronic components 130 may be electrically connected to the wiring layer 122b by various interconnection methods such as conventional packaging (e.g., paste soldering or the use of solder balls or bumps) or metal-to-metal bonding using an anisotropic conductive film (ACF), copper (Cu) or gold (Au). In order to electrically connect the first electronic components 130 to the wiring layer 122b, the wiring layer 122b may be partially exposed through the cavities C, but the present inventive concept is not restricted to this. That is, the first electronic components 130 may be electrically connected to any one of the first, second and third wiring layers 111b, 112b and 113b of the cavity layer 110 (e.g., the first wiring layer 111b), instead of being electrically connected to the wiring layer 122b.

Figure 3:
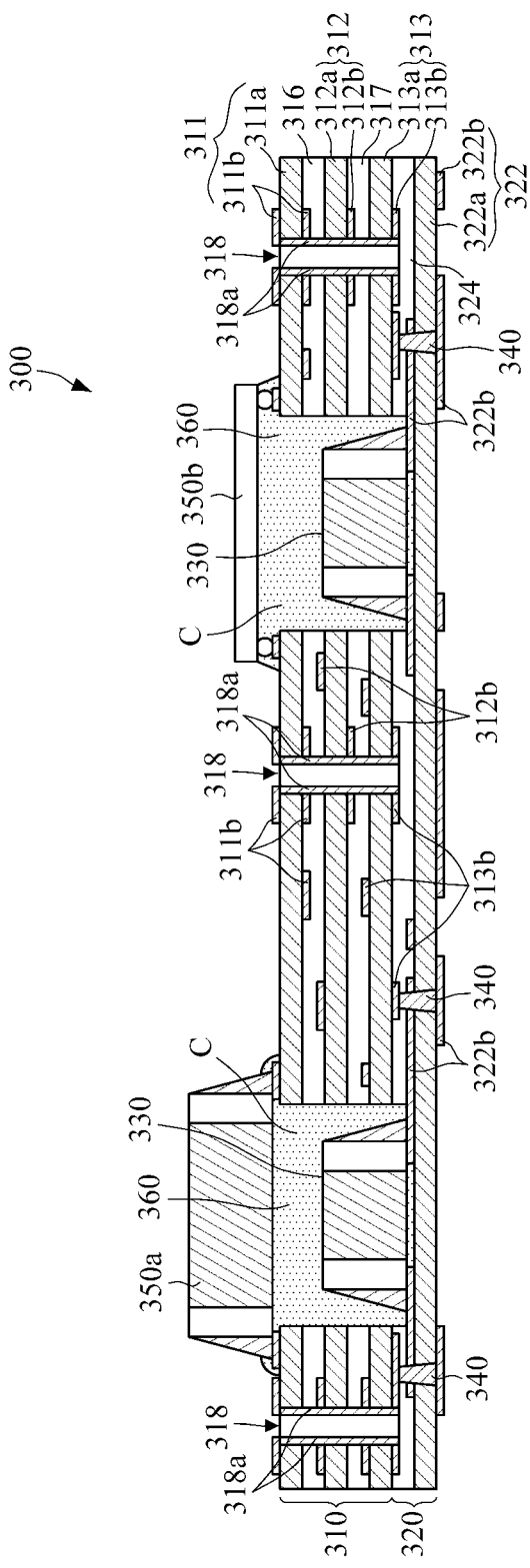
FIG. 3 is a cross-sectional view of another example of a multilayer laminate package according to an exemplary embodiment.

Each of the cavities C in which the first electronic components 130 are disposed may be filled with an electrically insulating material, i.e., a filling member (see, e.g., FIG. 3). The filling member may prevent the first electronic components 130 from being exposed to external shock, moisture and the air and may protect the first electronic components 130 against heat and electricity. The filling member may be formed of an insulating material such as a polymer, but the present inventive concept is not restricted to this.

One or more metalized blind vias 140 may be formed in the non-cavity layer 120. The metalized blind vias 140, which electrically connect the cavity layer 110 and the non-cavity layer 120, may be formed so that the third wiring layer 113b of the third circuit layer 113 of the cavity layer 110 and the wiring layer 122b of the circuit layer 122 of the non-cavity layer 120 can be electrically connected through the metalized blind via 140. The metalized blind vias 140 may be formed of a metal such as copper (Cu), aluminum (Al) or gold (Au). In this exemplary embodiment, the cavity layer 110 and the non-cavity layer 120 may be electrically connected simply by the metalized blind vias 140, and thus, the density of circuitry may be increased. In addition, since the metalized blind vias 140 are highly conductive, the multilayer laminate package 100 may also have excellent electrical properties.

Figure 2:
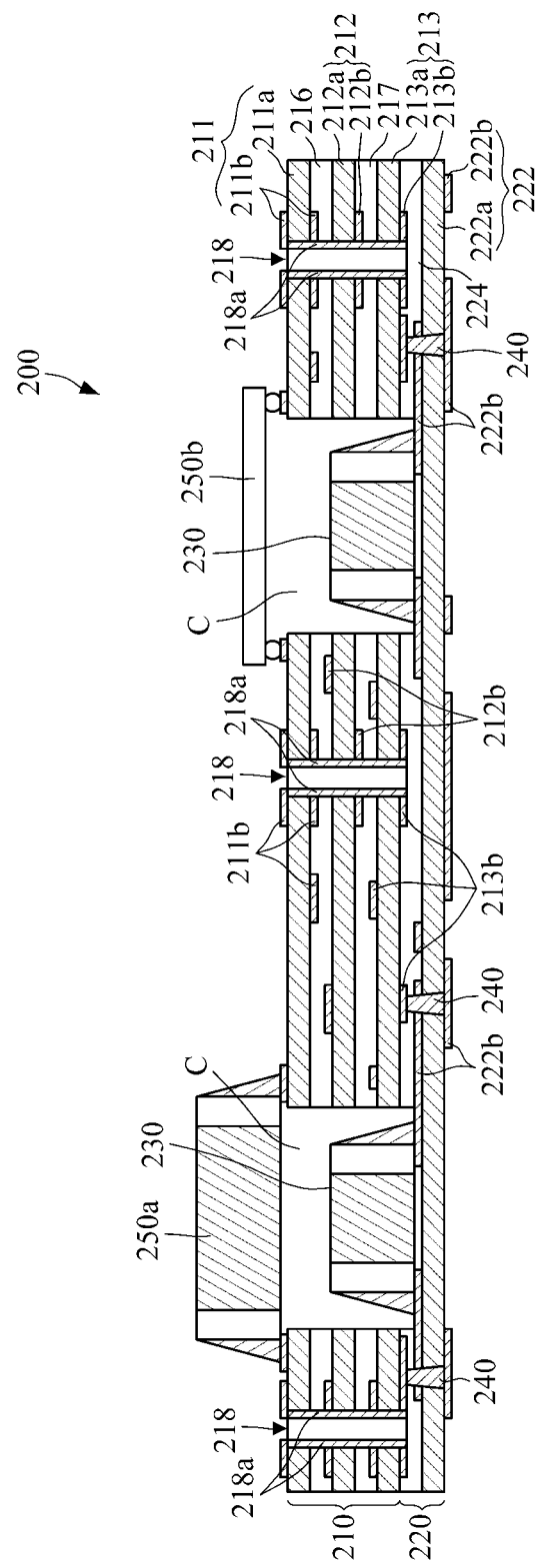
FIG. 2 is a cross-sectional view of another example of a multilayer laminate package according to an exemplary embodiment.

FIG. 2 is a cross-sectional view of another example of a multilayer laminate package 200. Referring to FIGS. 1 and 2, the structure of the multilayer laminate package 200 is similar to that of the multilayer laminate package 100 of FIG. 1 in that the multilayer laminate package 200 may include a cavity layer 210, a non-cavity layer 220, one or more first electronic components 230 and one or more metalized blind vias 240. However, the multilayer laminate package 200 may be distinguished from the multilayer laminate package 100 in that it also includes one or more second electronic components 250a and 250b (hereinafter collectively referred to as the second electronic components 250). The second electronic components 250 may be mounted over the cavities C that are in the cavity layer 210, and may be electrically connected to an uppermost circuit layer (i.e., a first circuit layer 211) of the cavity layer 210. The multilayer laminate package 200 will hereinafter be described in detail, focusing mainly on the differences from the multilayer laminate package 100.

Referring to FIG. 2, the cavity layer 210 may include two or more circuit layers (i.e., first, second and third circuit layers 211, 212 and 213) which are stacked with one or more adhesive layers (i.e., first and second adhesive layers 216 and 217) interposed therebetween. The first, second and third circuit layers 211, 212 and 213 may include first, second and third insulating films 211a, 212a and 213a, respectively, and first, second and third wiring layers 211b, 212b and 213b, respectively, which are formed on one or both surfaces of their respective insulating layers. The first, second and third wiring layers 211b, 212b and 213b may be electrically connected to one another through a plurality of plated through-holes 218. One or more openings or cavities C may be formed in the cavity layer 210 so that the non-cavity layer 220 below the cavity layer 210 can be exposed therethrough.

The non-cavity layer 220 may include an adhesive layer 224 and a circuit layer 222, which is bonded to the bottom surface of the cavity layer 210 with the adhesive layer 224 interposed therebetween. The circuit layer 222 may include an insulating film 222a and a wiring layer 222b, which has a pattern and is formed on one or both surfaces of the insulating film 222a. The first electronic components 230 may be mounted on the non-cavity layer 220, and may be electrically connected to portions of the wiring layer 222b of the non-cavity layer 220 exposed through the cavities C. There is no particular restriction on the types of first electronic components 230. One or more metalized blind vias 240 may be formed in the non-cavity layer 220. The metalized blind vias 240 may be formed in the non-cavity layer 220, and may electrically connect the cavity layer 210 and the non-cavity layer 220.

The second electronic components 250 may be mounted over the cavities C. The second electronic components 250 may be electrically connected to the first circuit layer 211 of the cavity layer 210, and particularly, to portions of the wiring layer 211b of the circuit layer 211 near the corresponding cavity C. The second electronic components 250 may also be mounted above the first electronic components 230. There are no particular restrictions on the types of second electronic components 250 and the method used to mount the second electronic components 250. In this exemplary embodiment, the second electronic components 250 may be mounted over the first electronic components 230 and may thus form a stack with the second electronic components 250. Thus, it is possible to improve packaging density. In addition, it is possible to provide excellent electrical properties by reducing the length of the connections between the first electronic components 230 and the second electronic components 250.

FIG. 3 is a cross-sectional view of another example of a multilayer laminate package 300. Referring to FIGS. 1 through 3, the structure of the multilayer laminate package 300 is similar to those of the multilayer laminate packages 100 and 200 of FIGS. 1 and 2 in that the multilayer laminate package 300 may include a cavity layer 310, a non-cavity layer 320, first electronic components 330 and one or more metalized blind vias 340. However, the multilayer laminate package 300 may be distinguished from the multilayer laminate package 100 in that it also includes at least one second electronic component, i.e., second electronic components 350a and 350b (hereinafter collectively referred to as the second electronic components 350). In addition, the multilayer laminate package 300 may be distinguished from the multilayer laminate package 200 in that cavities C in a cavity layer 310 are filled with a filling member 360. The multilayer laminate package 300 will hereinafter be described in detail, focusing mainly on differences with the multilayer laminate packages 100 and 200.

Referring to FIG. 3, the cavity layer 310 may include two or more circuit layers (i.e., first, second and third circuit layers 311, 312 and 313) which are stacked with one or more adhesive layers (i.e., first and second adhesive layers 316 and 317) interposed therebetween. The first, second and third circuit layers 311, 312 and 313 may include first, second and third insulating films 311a, 312a and 313a, respectively, and first, second and third wiring layers 311b, 312b and 313b, respectively, which are formed on one or both surfaces of their respective insulating layers. The first, second and third wiring layers 311b, 312b and 313b may be electrically connected to one another through a plurality of plated through-holes 318. One or more openings or cavities C may be formed in the cavity layer 310 so that the non-cavity layer 320 below the cavity layer 310 can be exposed therethrough.

The non-cavity layer 320 may include an adhesive layer 324 and a circuit layer 322, which is bonded to the bottom surface of the cavity layer 310 with the adhesive layer 324 interposed therebetween. The circuit layer 322 may include an insulating film 322a and a wiring layer 322b, which has a pattern and is formed on one or both surfaces of the insulating film 222a. The first electronic components 330 may be mounted on the non-cavity layer 320, and may be electrically connected to portions of the wiring layer 322b of the non-cavity layer 320 exposed through the cavities C. There is no particular restriction on the types of first electronic components 330. One or more metalized blind vias 340 may be formed in the non-cavity layer 320. The metalized blind vias 340 may be formed in the non-cavity layer 320, and may electrically connect the cavity layer 310 and the non-cavity layer 320.

The empty space in each of the cavities C may be filled with the filling member 360. The filling member 360 may protect the first electronic components 330 against external shock, moisture and pollutants, and may prevent the first electronic components 330 from being detached from the non-cavity layer 320 by fixing the first electronic components 330 in the cavities C. There is no particular restriction on the material of the filling member 360. The filling member 360 may be formed of a polymer such as an underfill polymer or engineered polymer.

The second electronic components 350 may be mounted over the cavities C, and particularly, on the filling member 360 that fills the cavities C. More specifically, the second electronic components 350 may be mounted on the filling member 360 and may be electrically connected to the uppermost circuit layer (i.e., the first circuit layer 311) of the cavity layer 310, and particularly, to portions of the wiring layer 311b of the circuit layer 311 near the corresponding cavity C. There are no particular restrictions on the types of second electronic components 350 and the method used to mount the second electronic components 350. In this exemplary embodiment, the second electronic components 350 may be mounted over the first electronic components 330 so as to form a stack. Thus, it is possible to improve packaging density. In addition, it is possible to provide excellent electrical properties by reducing the length of the connections between the first electronic components 330 and the second electronic components 350.

Figure 4:
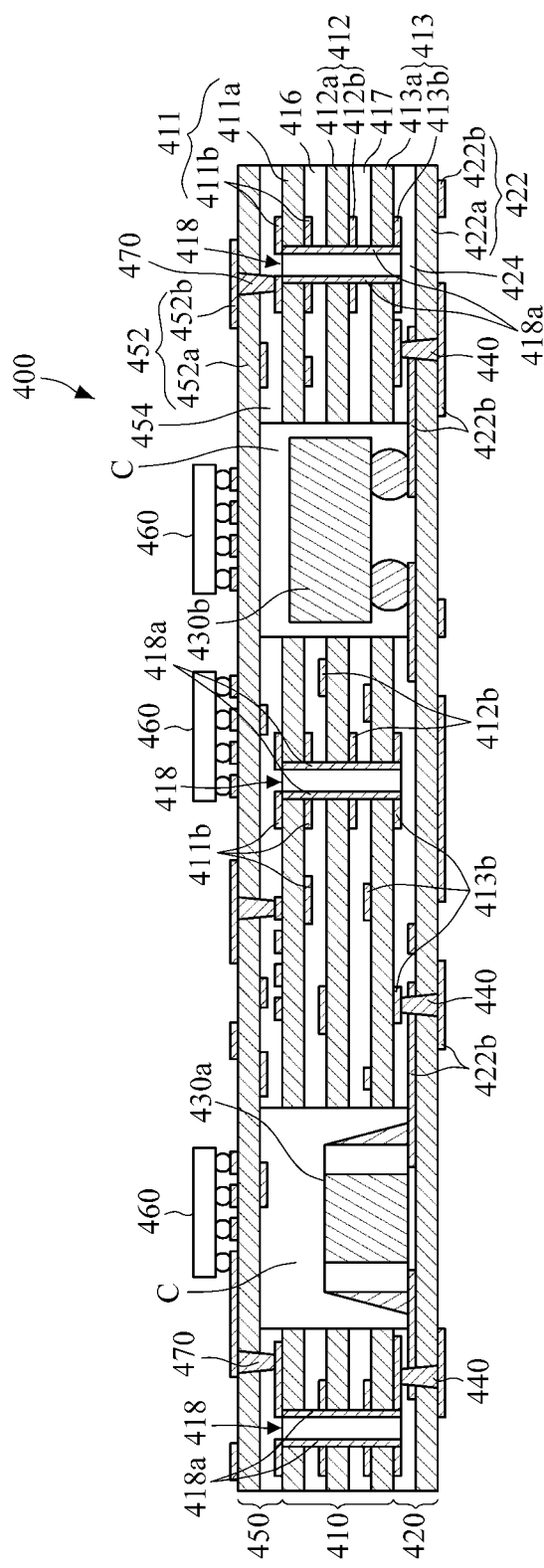
FIG. 4 is a cross-sectional view of another example of a multilayer laminate package according to an exemplary embodiment.

FIG. 4 is a cross-sectional view of another example of a multilayer laminate package 400. Referring to FIGS. 1 through 4, the structure of the multilayer laminate package 400 is similar to those of the multilayer laminate packages 100, 200 and 300 of FIGS. 1, 2 and 3 in that the multilayer laminate package 400 may include a cavity layer 410, a first non-cavity layer 420, one or more first electronic components (hereinafter collectively referred to as the first electronic components 430) and one or more first metalized blind vias 440. However, the multilayer laminate package 400 may be distinguished from the multilayer laminate packages 100, 200 and 300 in that it also includes a second non-cavity layer 450 and second blind vias 470. In addition, the multilayer laminate package 400 may be distinguished from the multilayer laminate package 100 in that it also includes one or more second electronic components 460 mounted on the second non-cavity layer 450. The multilayer laminate package 400 will hereinafter be described in detail, focusing mainly on differences with the multilayer laminate packages 100, 200 and 300.

Referring to FIG. 4, the cavity layer 410 may include two or more circuit layers (i.e., first, second and third circuit layers 411, 412 and 413) which are stacked with one or more adhesive layers (i.e., first and second adhesive layers 416 and 417) interposed therebetween. The first, second and third circuit layers 411, 412 and 413 may include first, second and third insulating films 411a, 412a and 413a, respectively, and first, second and third wiring layers 411b, 412b and 413b, respectively, which are formed on one or both surfaces of their respective insulating layers. The first, second and third wiring layers 411b, 412b and 413b may be electrically connected to one another through a plurality of plated through-holes 418. One or more openings or cavities C may be formed in the cavity layer 410 so that the first non-cavity layer 420 below the cavity layer 410 can be exposed therethrough.

The first non-cavity layer 420 may include an adhesive layer 424 and a circuit layer 422, which is bonded to the bottom surface of the cavity layer 410 with the adhesive layer 424 interposed therebetween. The circuit layer 422 may include an insulating film 422a and a wiring layer 422b, which has a pattern and is formed on one or both surfaces of the insulating film 422a. The first electronic components 430 may be mounted on the first non-cavity layer 420, and may be electrically connected to portions of the wiring layer 422b of the first non-cavity layer 420 exposed through the cavities C. There is no particular restriction on the types of first electronic components 430. One or more metalized blind vias 440 may be formed in the non-cavity layer 420. The first metalized blind vias 440 may be formed in the non-cavity layer 420, and may electrically connect the cavity layer 410 and the non-cavity layer 420.

The multilayer laminate package 400 may also include the second non-cavity layer 450. The second non-cavity layer 450 may include an adhesive layer 454 and a circuit layer 452 bonded to the top surface of the cavity layer 410 with the adhesive layer 454 interposed therebetween. The second non-cavity layer 450 may include an adhesive layer 454 and a circuit layer 452 bonded to the top surface of the cavity layer 410 with the adhesive layer 454 interposed therebetween. The second non-cavity layer 450 may close the open tops of the cavities C. The circuit layer 452 may include an insulating film 452a and a wiring layer 452b which has a pattern and is formed on one or both surfaces of the insulating film 452a. The second electronic components 460 may be mounted on the second non-cavity layer 450, and may be electrically connected to the wiring layer 452b of the circuit layer 452. The second electronic components 460 may be mounted on the second non-cavity layer 450 in an area over the first electronic components (i.e., stacked), or in other areas of the second non-cavity layer 450 that are not over the second electronic components 450 (i.e., not stacked). There are no particular restrictions on the types of second electronic components 460 and the method used to mount the second electronic components 460. The second metalized blind vias 470 may be formed in the second non-cavity layer 450. The second metalized blind vias 470 may be formed in the second non-cavity layer 450, and may electrically connect the first wiring layer 411b of the cavity layer 410 and the wiring layer 452b of the second non-cavity layer 450.

In this exemplary embodiment, the second non-cavity layer 450 may be additionally formed on the cavity layer 410, and may thus be used as the space for mounting the second electronic components 460 thereon. Thus, it is possible to improve packaging density.

Figure 5:
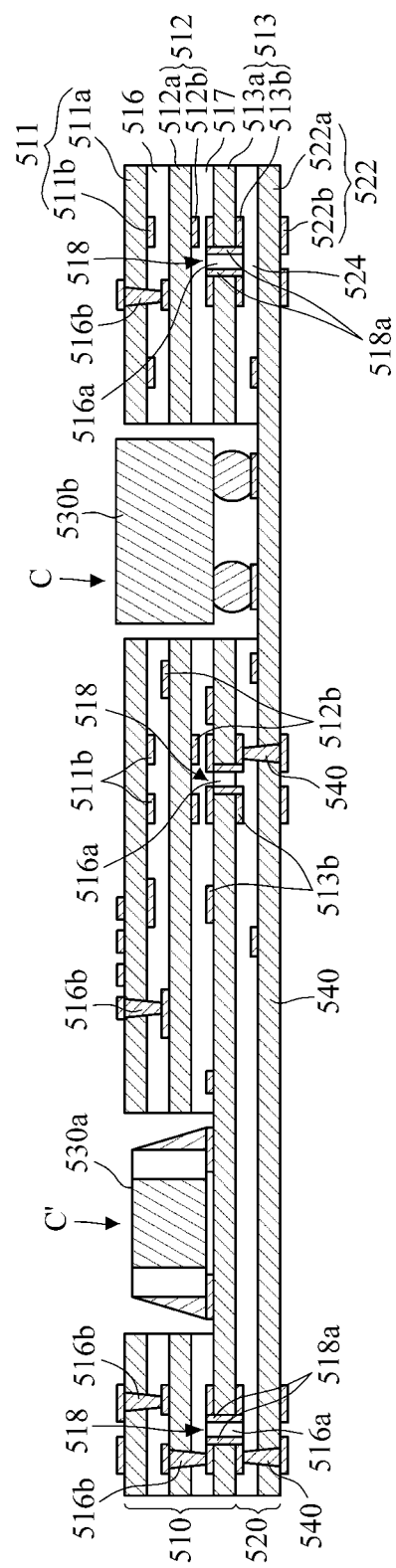
FIG. 5 is a cross-sectional view of another example of a multilayer laminate package according to an exemplary embodiment.

FIG. 5 is a cross-sectional view of another example of a multilayer laminate package 500. Referring to FIG. 5, the structure of the multilayer laminate package 500 is similar to that of the multilayer laminate package 100 of FIG. 1 in that the multilayer laminate package 500 may include a cavity layer 510, a non-cavity layer 520, one or more first electronic components 530*a* and 530*b* (hereinafter collectively referred to as the first electronic components 530) and one or more first metalized blind vias 540. However, the multilayer laminate package 500 may be distinguished from the multilayer laminate package 100 in that it also includes a second cavity C' whose depth is different from that of the cavities C of the multilayer laminate package 100, and that first, second and third wiring layers 511*b*, 512*b* and 513*b* of the cavity layer 510 are connected to one another through a plurality of plated through holes 516*a* and a plurality of second metalized blind vias 516*b*. The multilayer laminate package 500 will hereinafter be described in detail, focusing mainly on differences with the multilayer laminate package 100.

Referring to FIG. 5, the cavity layer 510 may include two or more circuit layers (i.e., first, second and third circuit layers 511, 512 and 513) which are stacked with one or more adhesive layers (i.e., first and second adhesive layers 516 and 517) interposed therebetween. The first, second and third circuit layers 511, 512 and 513 may include first, second and third insulating films 511*a*, 512*a* and 513*a*, respectively, and first, second and third wiring layers 511*b*, 512*b* and 513*b*, respectively, which are formed on one or both surfaces of their respective insulating layers. Portions of the third wiring layer 513*b* on opposite surfaces of the third insulating film 513*a* may be electrically connected to each other through the plated through-holes 516*a*. The first and second circuit layers 511 and 512 and the second and third circuit layers 512 and 513 may be electrically connected to each other via the metalized blind vias 516*b*. A first cavity C may be formed through the cavity layer 510 so that the non-cavity layer 520 can be exposed therethrough. The second cavity C' may be formed to a lesser depth than the first cavity C so that the third circuit layer 513 can be exposed therethrough.

The non-cavity layer 520 may include an adhesive layer 524 and a circuit layer 522, which is bonded to the bottom surface of the cavity layer 510 with the adhesive layer 524 interposed therebetween. The circuit layer 522 may include an insulating film 522*a* and a wiring layer 522*b*, which has a pattern and is formed on one or both surfaces of the insulating film 522*a*. The first electronic component 530*b* may be mounted on the non-cavity layer 520, and may be electrically connected to portions of the wiring layer 522*b* of the non-cavity layer 520 exposed through the first cavity C. The first electronic component 530*a* may be mounted on the third circuit layer 513 of the cavity layer 510, and may be electrically connected to portions of the third wiring layer 513*b* of the cavity layer 510 exposed through the second cavity C'. There is no particular restriction on the types of first electronic components 530. However, the height of the first electronic component 530*b* may be greater than the depth of the first cavity C. One or more metalized blind vias 540 may be formed in the non-cavity layer 520. The metalized blind vias 540 may be formed in the non-cavity layer 520, and may electrically connect the cavity layer 510 and the non-cavity layer 520.

An example method of manufacturing a multilayer laminate package, and particularly, an example method of manufacturing the multilayer laminate package 100 of FIG. 1, will hereinafter be described in detail with reference to FIGS. 6A through 6G. The following description of the manufacture of the multilayer laminate package 100 can be directly applied to the multilayer laminate packages 200, 300, 400 and 500. In addition, although not specifically mentioned, the above description of the multilayer laminate package 100 can be directly applied to the following description of the manufacture of the multilayer laminate package 100.

Figure 6A:
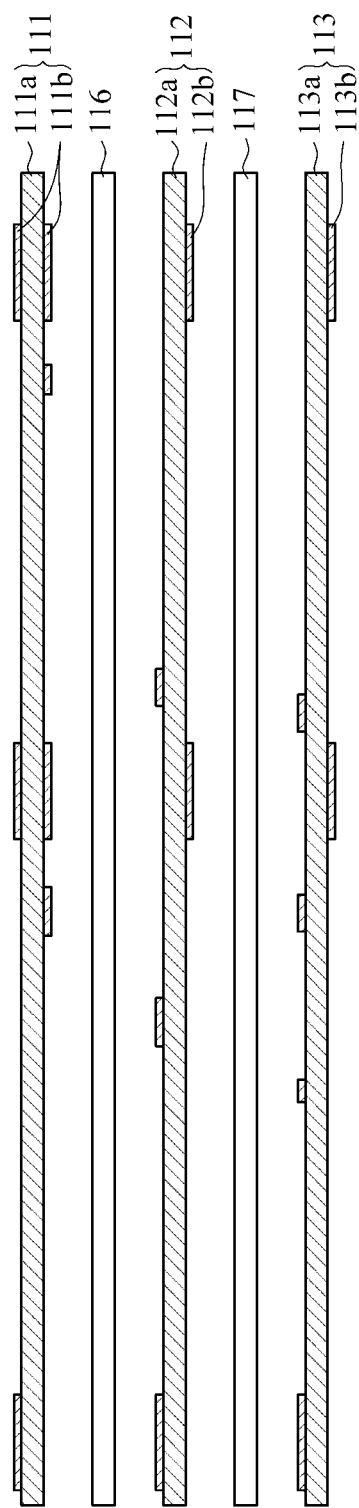
FIGS. 6A through 6G are cross-sectional views for explaining an example method of manufacturing a multilayer laminate package according to an exemplary embodiment.
Figure 6B:
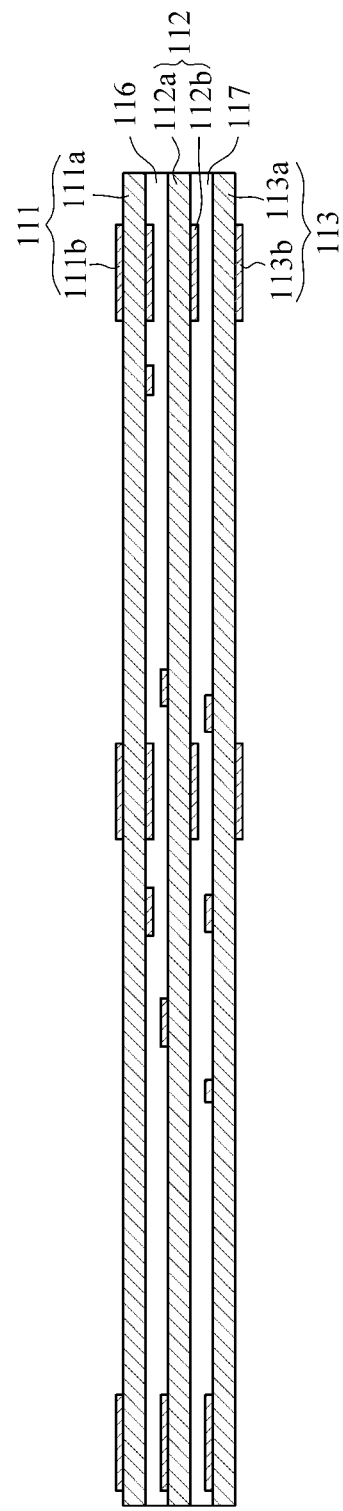
Figure 6C:
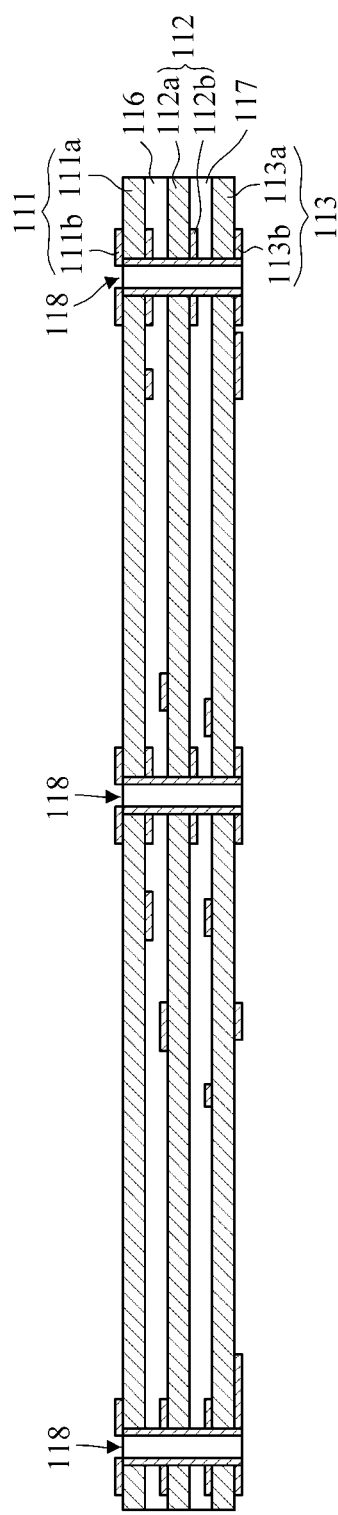
Figure 6D:
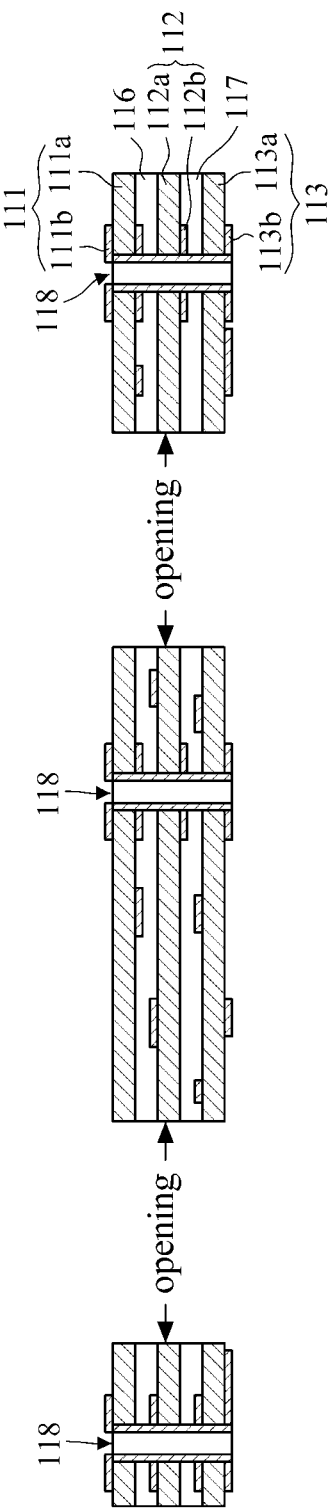
Figure 6E:
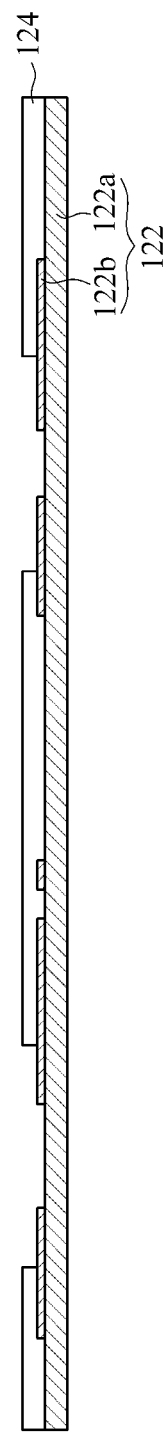
Figure 6F:
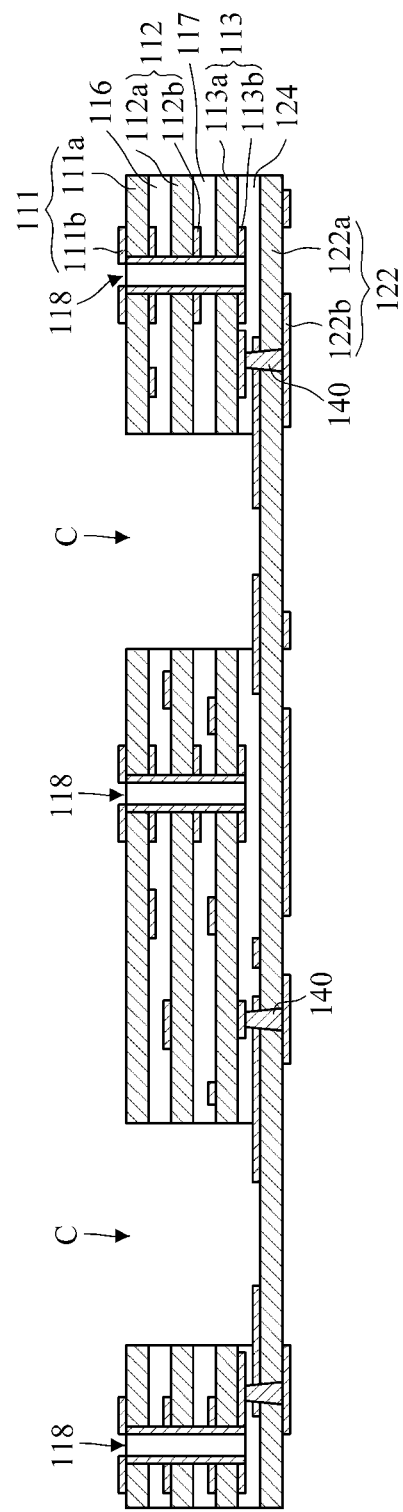
Figure 6G:
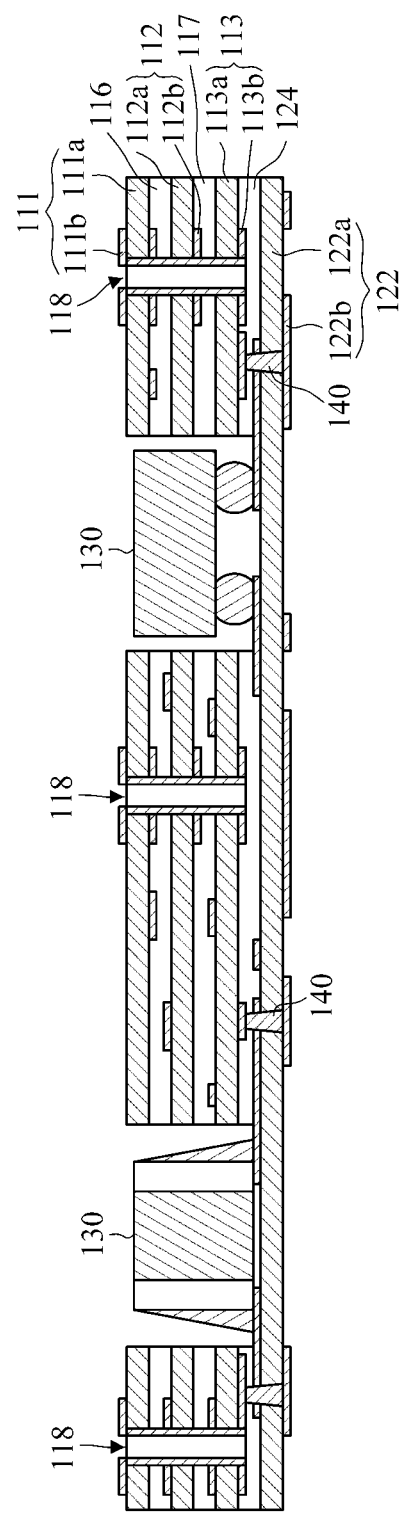

FIGS. 6A through 6G are cross-sectional views for explaining an example method of manufacturing the multilayer laminate package 100 of FIG. 1. More specifically, FIGS. 6A through 6D illustrate a series of processes for preparing the cavity layer 110 of the multilayer laminate package 100. As a result of the series of processes illustrated in FIGS. 6A through 6D, the cavity layer 110, which has one or more openings formed therethrough and includes a stack of the first, second and third circuit layers 111, 112 and 113 and the first and second adhesive layers 116 and 117 interposed among the first, second and third circuit layers 111, 112 and 113, may be prepared. FIGS. 6E through 6G illustrate a series of processes for forming the non-cavity layer 120, bonding and electrically connecting the non-cavity layer 120 to the bottom surface of the cavity layer 110, and mounting the first electronic components 130 in the cavities C in the cavity layer 110.

Referring to FIG. 6A, the first, second and third circuit layers 111, 112 and 113, which include the first, second and third insulating films 111*a*, 112*a* and 113*a*, respectively, and the first, second and third wiring layers 111*b*, 112*b* and 113*b*, respectively, may be prepared. The first, second and third wiring layers 111*b*, 112*b* and 113*b* may have a pattern, and may be formed on one or both surfaces of their respective insulating films. Each of the first, second and third wiring layers 111*b*, 112*b* and 113*b* may be formed by forming a metallic layer such as a copper layer on a corresponding insulating layer and etching the metallic layer into a desired circuit pattern. Thereafter, the first, second and third circuit layers 111, 112, and 113 may be deposited one on top of another in any desired order, and the first and second adhesive layers 116 and 117 may be interposed among the first, second and third circuit layers 111, 112, and 113.

Referring to FIG. 6B, the first, second and third circuit layers 111, 112, and 113 may be bonded to one another using the first and second adhesive layers 116 and 117. More specifically, the third, second and first circuit layers 113, 112, and 111 may be sequentially stacked, and the first and second adhesive layers 116 and 117 may be interposed between the first and second circuit layers 111 and 112 and between the second and third circuit layers 112 and 113, respectively. In other words, the third circuit layer 113 is provided, and the second adhesive layer 117 is formed thereon. Then, the second circuit layer 112 is provided on the second adhesive layer 117 so as to be bonded to the third circuit layer 113. The first adhesive layer 116 is then provided on the second circuit layer 112, and the first circuit layer 111 is provided on the first adhesive layer 116 so as to be bonded to the second circuit layer 112. Thereafter, the stack of the first, second and third circuit layers 111, 112, and 113 may be pressed from above, below or both. In order to improve the bonding between the first, second and third circuit layers 111, 112, and 113, the stack of the first, second and third circuit layers 111, 112, and 113 may be pressed while applying heat in consideration of the material of the first and second adhesive layers 116 and 117.

Referring to FIG. 6C, the plated through holes 118, which electrically connect the first, second and third wiring layers 111*b*, 112*b* and 113*b*, may be formed through the stack of the first, second and third circuit layers 111, 112, and 113. The number of plated through holes 118 is not limited and the plated through holes 118 are provided to electrically connect the first, second and third wiring layers 111*b*, 112*b* and 113*b*. The plated through holes 118 may be formed using a known method. For example, the plated through holes 118 may be formed by preparing a number of through holes in the stack of the first, second and third circuit layers 111, 112, and 113 and coating the inside of each of the through holes with a metallic material through plating. During the plating of the inside of each of the through holes with the metallic material, the whole stack of the first, second and third circuit layers 111, 112, and 113 and the first and second adhesive layers 116 and 117, except for the through holes, may be covered with a passivation layer and may thus be able to be prevented from being plated with the metallic material.

Referring to FIG. 6D, one or more openings may be formed through the stack of the first, second and third circuit layers 111, 112, and 113. There is no particular restriction on the method used to form the openings. The number and size of openings may be appropriately determined in consideration of the number and size of first electronic components 130 to be mounted in the cavities C. The openings do not necessarily need to be formed completely through the stack of the first, second and third circuit layers 111, 112, and 113. That is, some of the openings may penetrate through only some of the first, second and third circuit layers 111, 112 and 113 of the cavity layer 110, for example, the first and second circuit layers 111 and 112, as shown in FIG. 5.

Referring to FIG. 6E, once the cavity layer 110 is prepared, the non-cavity layer 120 may be prepared separately from the cavity layer 110. More specifically, the insulating film 122a, which is formed of a prepreg, may be prepared, and the wiring layer 122b, which has a pattern, may be formed on one or both surfaces of the insulating film 122a. The wiring layer 122b may be formed on portions on the top surface of the insulating film 122a corresponding to the locations of the openings in the cavity layer 110, and may thus serve as a connection pad for each of the first electronic components 130 to be mounted in the cavities C.

Referring to FIG. 6F, the non-cavity layer 120 may be bonded to the bottom surface of the cavity layer 110. Thereafter, the metalized blind vias 140, which electrically connect the lowermost wiring layer (i.e., the third wiring layer 113b) of the cavity layer 110 and the wiring layer 122b of the non-cavity layer 120, may be formed in the non-cavity layer 120. More specifically, the non-cavity layer 120 may be bonded to the bottom surface of the cavity layer 110 by interposing the adhesive layer 124 between the non-cavity layer 120 and the cavity layer 110 and pressing the non-cavity layer 120 and the cavity layer 110 against each other. As a result, the openings in the cavity layer 110 may be turned into the cavities C with a closed bottom, and the wiring layer 122b of the non-cavity layer 120 may be exposed through the cavities C.

Thereafter, the metalized blind vias 140 may be formed through the non-cavity layer 120. More specifically, the metalized blind vias 140 may be formed by forming through holes in the non-cavity layer 120 so as to expose the lowermost wiring layer (i.e., the third wiring layer 113b) of the cavity layer 110 therethrough and filling the through holes with a metallic material. The metallic material may be any type of metal with excellent electrical properties, such as Cu, Al, Au, and silver (Ag). The through holes may be filled with the metallic material through deposition, which can provide excellent gap-fill properties, but the present inventive concept is not restricted to this.

Referring to FIG. 6G, the first electronic components 130 may be disposed in the cavities C and may thus be mounted on the circuit layer 122. The first electronic components 130 may be electrically connected to portions of the wiring layer 122b of the circuit layer 122 exposed through the cavities C. The first electronic components 130 may be mounted in the cavities C using a packaging method such as wire bonding or flip-chip bonding, but the present inventive concept is not restricted to this. Once the cavity layer 110 and the non-cavity layer 120 are bonded to each other and the first electronic components 130 are mounted in the cavities C, it is advantageous to perform no further pressing, particularly to the first electronic components 130, in order to minimize the probability of damage to the first electronic components 130.

The manufacture of the multilayer laminate package 200 of FIG. 2 is basically the same as the manufacture of the multilayer laminate package 100, except that it further involves mounting the second electronic components 250 over the cavity layer 210. There is no particular restriction on the method used to mount the second electronic components 250 over the cavity layer 210. The second electronic components 250 may be mounted over the cavity layer 210 and may thus be able to be electrically connected to the uppermost wiring layer (i.e., the first wiring layer 211b) of the cavity layer 210.

The manufacture of the multilayer laminate package 300 of FIG. 3 is basically the same as the manufacture of the multilayer laminate package 200, except that it further involves filling the cavities C in which the first electronic components 330 are mounted with an insulating material. The filling of the cavities C with the insulating material may be performed before or after the mounting of the second electronic components 350 over the cavities C.

The manufacture of the multilayer laminate package 400 of FIG. 4 is basically the same as the manufacture of the multilayer laminate package 100, except that it further involves preparing the non-cavity layer 454 including the circuit layer 452, bonding the non-cavity layer 450 to the top surface of the cavity layer 410 with the adhesive layer 454 interposed therebetween for the non-cavity layer 450 to close the cavities C in the cavity layer 410, forming the metalized blind vias 470, which electrically connect the first wiring layer 411b of the cavity layer and the wiring layer 452b of the non-cavity layer 450, in the non-cavity layer 450, and mounting the second electronic components 460 on the non-cavity layer 450. There is no particular restriction on the method used to mount the second electronic components 460. The second electronic components 460 may be mounted on the non-cavity layer 450 and may thus be able to be electrically connected to the uppermost wiring layer of the non-cavity layer 450, i.e., the wiring layer 452b.

Figure 7A:
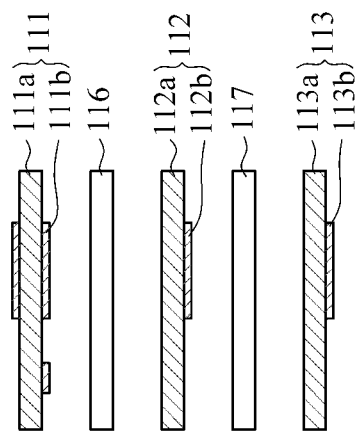
FIGS. 7A through 7F are cross-sectional views for explaining another example method of manufacturing a multilayer laminate package according to an exemplary embodiment.
Figure 7A:
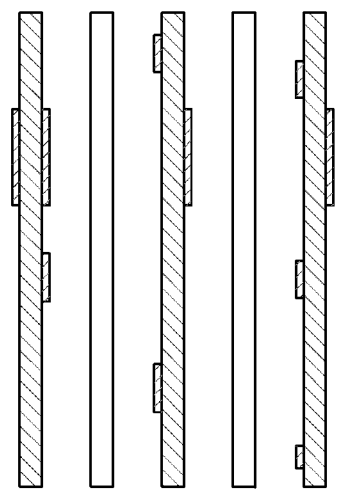
Figure 7A:
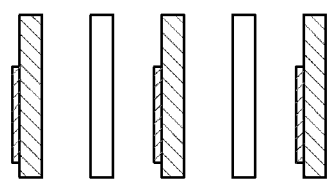
Figure 7B:
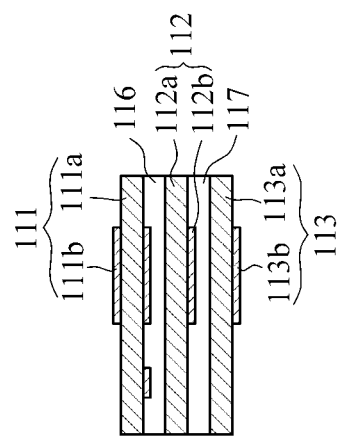
Figure 7B:
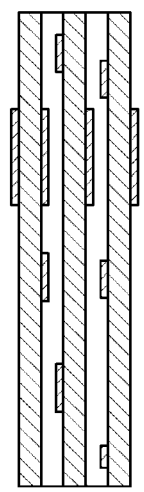
Figure 7B:
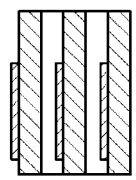
Figure 7C:
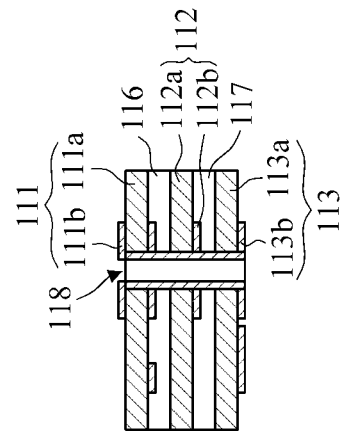
Figure 7C:
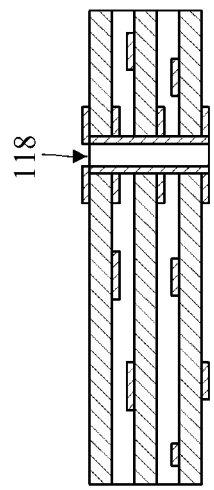
Figure 7C:
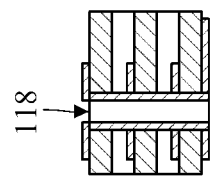
Figure 7D:
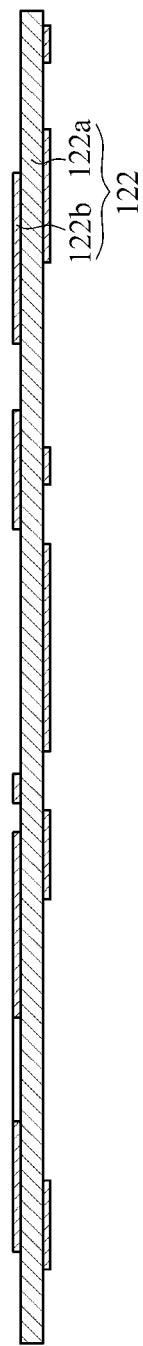
Figure 7E:
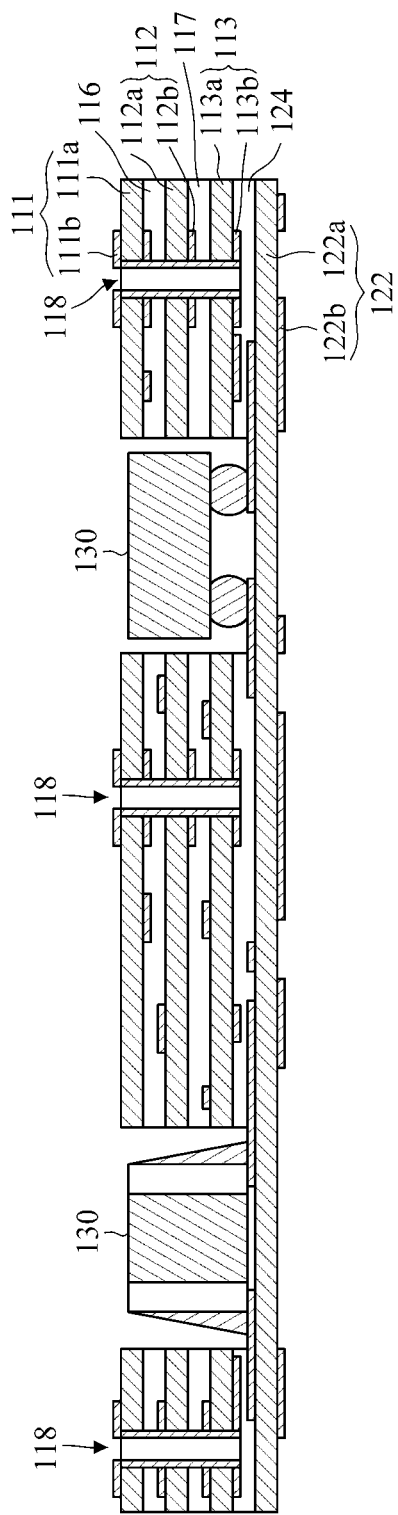
Figure 7F:
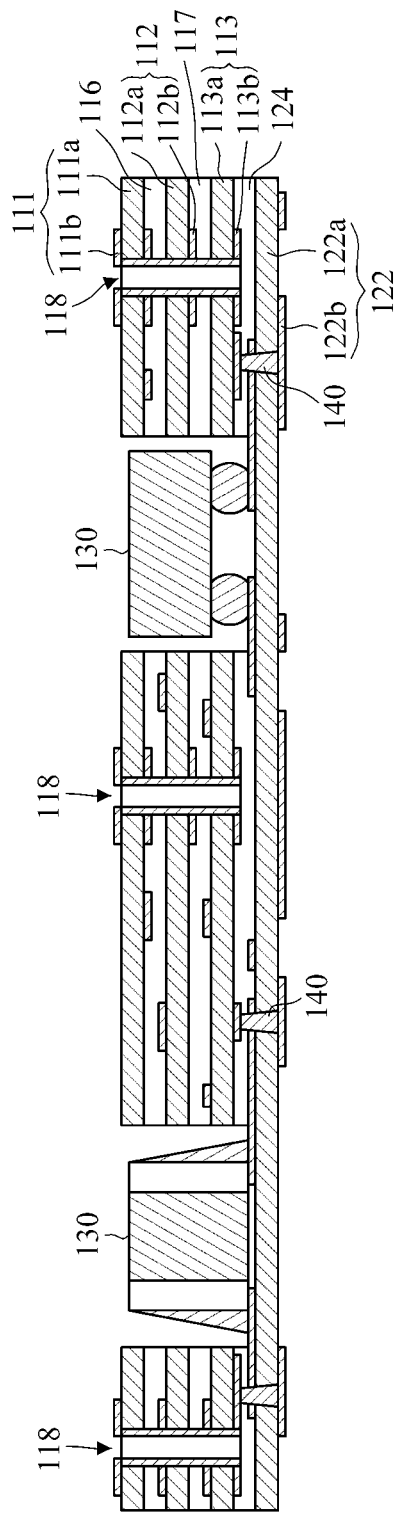

FIGS. 7A through 7F are cross-sectional views for explaining another example of a method of manufacturing the multilayer laminate package 100 of FIG. 1 according to an exemplary embodiment. More specifically, FIGS. 7A through 7C illustrate a series of processes for preparing the cavity layer 110 of the multilayer laminate package 100. As a result of the series of processes illustrated in FIGS. 7A through 7C, the cavity layer 110, which has one or more openings formed therethrough and includes a stack of the first, second and third circuit layers 111, 112 and 113 and the first and second adhesive layers 116 and 117 interposed among the first, second and third circuit layers 111, 112 and 113, may be prepared. FIGS. 7D through 7F illustrate a series of processes for forming the non-cavity layer 120, bonding and electrically connecting the non-cavity layer 120 to the bottom surface of the cavity layer 110, and mounting the first electronic components 130 in the cavities C in the cavity layer 110. The example method illustrated in FIGS. 7A through 7F will hereinafter be described in detail, focusing mainly on differences with the example method illustrated in FIGS. 6A through 6G.

Referring to FIG. 7A, the first, second and third circuit layers 111, 112 and 113, which include the first, second and third insulating films 111a, 112a and 113a, respectively, and the first, second and third wiring layers 111b, 112b and 113b, respectively, may be prepared. The first, second and third wiring layers 111*b*, 112*b* and 113*b* may have a pattern, and may be formed on one or both surfaces of their respective insulating films. One or more openings may be formed in each of the first, second and third circuit layers 111, 112 and 113 such that the openings in one of the first, second and third circuit layers 111, 112 and 113 can correspond to their respective counterparts in another one of the first, second and third circuit layers 111, 112 and 113. The first, second and third circuit layers 111, 112 and 113 may be stacked in any desired order, and the first and second adhesive layers 116 and 117 may be interposed among the first, second and third circuit layers 111, 112, and 113.

Referring to FIG. 7B, the first, second and third circuit layers 111, 112, and 113 may be bonded to one another applying the first and second adhesive layers 116 and 117. More specifically, the third, second and first circuit layers 113, 112, and 111 may be sequentially stacked, and the first and second adhesive layers 116 and 117 may be interposed between the first and second circuit layers 111 and 112 and between the second and third circuit layers 112 and 113, respectively. Thereafter, the stack of the first, second and third circuit layers 111, 112, and 113 may be pressed from above, below or both. Due to the openings in each of the first, second and third circuit layers 111, 112, and 113, as many openings as there are openings in each of the first, second and third circuit layers 111, 112, and 113 may be defined in the whole stack of the first, second and third circuit layers 111, 112, and 113.

Referring to FIG. 7C, the plated through holes 118, which electrically connect the first, second and third wiring layers 111*b*, 112*b* and 113*b*, may be formed through the stack of the first, second and third circuit layers 111, 112, and 113. The number of the plated through holes 118 is not restricted, but are formed to electrically connect the first, second and third wiring layers 111*b*, 112*b* and 113*b*. The plated through holes 118 may be formed using a known method. For example, the plated through holes 118 may be formed by preparing a number of through holes in the stack of the first, second and third circuit layers 111, 112, and 113 and coating the inside of each of the through holes with a metallic material through plating.

Referring to FIG. 7D, the non-cavity layer 120 may be prepared. Thereafter, the first electronic components 130 may be mounted on the non-cavity layer 120. More specifically, the insulating film 122*a*, which is formed of a prepreg, may be prepared, and the wiring layer 122*b*, which has a pattern, may be formed on one or both surfaces of the insulating film 122*a*. The wiring layer 122*b* may be formed on portions on the top surface of the insulating film 122*a* corresponding to the locations of the openings in the cavity layer 110, and may thus serve as a connection pad for each of the first electronic components 130 to be mounted in the cavities C. In short, the first electronic components 130 may be mounted on the circuit layer 122 and may thus be able to be electrically connected to portions of the wiring layer 122*b* that serve as connection pads. In this example method, since the first electronic components 130 are mounted on the non-cavity layer 120 before the bonding of the non-cavity layer 120 to the cavity layer 110, solder printing can be performed using nearly all types of methods available such as screen printing.

Referring to FIG. 7E, the circuit layer 122 may be disposed below the cavity layer 110 with the adhesive layer 124 interposed therebetween, and may then be pressed down on the cavity layer 110. As a result, the non-cavity layer 120 may be bonded to the bottom surface of the cavity layer 110, and the first electronic components 130 may be disposed inside the openings in the cavity layer 110.

Referring to FIG. 7F, the metalized blind vias 140, which electrically connect the lowermost wiring layer (i.e., the third wiring layer 113*b*) of the cavity layer 110 and the wiring layer 122*b* of the non-cavity layer 120, may be formed through the non-cavity layer 120. More specifically, the metalized blind vias 140 may be formed by forming through holes in the non-cavity layer 120 so as to expose the third wiring layer 113*b* of the cavity layer 110 therethrough and filling the through holes with a metallic material. The metallic material may be any type of metal with excellent electrical properties, such as Cu, Al, Au, and Ag.

As described above, according to the present inventive concept, it is possible to contribute to the reduction of the size, thickness and weight of IT devices by using an embedded packaging technique. In addition, it is possible to embed nearly all types of electronic components available in a package by appropriately adjusting the deposition thickness of the layers and/or the number of layers of the package. Moreover, since layers of a cavity layer and layers of a non-cavity layer are electrically connected to one another using plated through holes and the cavity layer and the non-cavity layer are connected to each other using metalized blind vias, it is possible to improve the electrical properties of a whole multilayer laminate package. Furthermore, since the cavity layer and the non-cavity layer are prepared separately and electronic components are all embedded in the cavities in the cavity layer before or after a lamination process, it is possible to ensure high reworkability and provide a high yield of IT devices.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multilayer laminate package comprising:
    a cavity layer comprising a first adhesive layer, two first circuit layers, which are stacked with the first adhesive layer interposed therebetween, and at least one first opening, which is formed through the cavity layer;
    a first non-cavity layer comprising a second adhesive layer and a second circuit layer, the first non-cavity layer being bonded to a surface of the cavity layer with the second adhesive layer interposed therebetween so as to close one side of the at least one first opening;
    a first electronic component mounted in the first opening and electrically connected to a portion of the second circuit layer of the first non-cavity layer exposed through the first opening; and
    a first metalized blind via that is formed through the first non-cavity layer and that electrically connects one of the two first circuit layers of the cavity layer and the second circuit layer of the first non-cavity layer.

2. The multilayer laminate package of claim 1, further comprising a plated through hole formed through the first circuit layers to electrically connect the two first circuit layers.

3. The multilayer laminate package of claim 1, wherein the two first circuit layers or the second circuit layer comprises:
    a prepreg layer, which is completely cured; and
    wiring which is formed on one or both surfaces of the prepreg layer.

4. The multilayer laminate package of claim 1, further comprising a filling member that fills an empty space in the first opening with an electrically insulating material.

5. The multilayer laminate package of claim 1, wherein a space is formed between the first electric component and walls of the cavity layer that form the first opening, and
the multilayer laminate package further comprises a filling member comprising an electrically insulating material that fills in the space.

6. The multilayer laminate package of claim 1, further comprising:
a second non-cavity layer comprising a third adhesive layer and a third circuit layer, the second non-cavity layer being bonded to another surface of the cavity layer with the third adhesive layer interposed therebetween so as to close another side of the first opening;
a second metalized blind via that is formed through the second non-cavity layer and the third adhesive layer and that electrically connects the other of the two first circuit layers of the cavity layer and the third circuit layer of the second non-cavity layer; and
a second electronic component that is mounted on the second non-cavity layer and that is electrically connected to the third circuit layer of the second non-cavity layer.

7. The multilayer laminate package of claim 1, further comprising a second electronic component that is mounted over the first opening and that is electrically connected to another of the two first circuit layer of the cavity layer.

8. The multilayer laminate package of claim 7, further comprising a filling member that fills an empty space in the first opening with an electrically insulating material,
wherein the second electronic component is further configured to be mounted on the filling member.

9. The multilayer laminate package of claim 1, further comprising:
at least one second opening that is formed in the cavity layer and penetrates through only one of the two first circuit layers; and
a fourth electronic component mounted in the second opening.

10. The multilayer laminate package of claim 9,
wherein the cavity layer further comprises additional first circuit layers and additional adhesive layers,
the additional first circuit layers are stacked between the two first circuit layers with the additional adhesive layers interposed therebetween, and
the second opening that is formed in the cavity layer penetrates through less than all of the two first circuit layers and the additional first circuit layers that are stacked together.

11. The multilayer laminate package of claim 1, wherein the cavity layer further comprises additional first circuit layers and additional adhesive layers, wherein the additional first circuit layers are stacked between the two first circuit layers with the additional adhesive layers interposed therebetween.

12. A method of manufacturing a multilayer laminate package, the method comprising: preparing a cavity layer including a first adhesive layer, two first circuit layers, which are stacked with the first adhesive layer interposed therebetween, and an opening, which is formed through the first circuit layers and the first adhesive layer; preparing a first non-cavity layer including a second circuit layer, which includes a first wiring layer, at least a portion of which is formed at a location thereon corresponding to the location of the opening; bonding the first non-cavity layer to a surface of the cavity layer with a second adhesive layer interposed therebetween such that the first non-cavity layer closes one side of the opening and the at least a portion of the first wiring layer is arranged at the location corresponding to the location of the opening; mounting a first electronic component at the location on the first non-cavity layer corresponding to the location of the opening such that the first electronic component can be electrically connected to the first wiring layer; and forming a first metalized blind via through the second circuit layer and the second adhesive layer, the first metalized blind via electrically connecting one of the first circuit layers of the cavity layer and the second circuit layer.

13. The method of claim 12, further comprising forming a plated through hole through the cavity layer, the plated through hole electrically connecting one of the two first circuit layers to another of the two first circuit layers.

14. The method of claim 12, further comprising filling an empty space in the opening with an electrically insulating material.

15. The method of claim 12, further comprising: preparing a second non-cavity layer comprising a third circuit layer having a wiring with a pattern; bonding the second non-cavity layer to another surface of the cavity layer with a third adhesive layer interposed therebetween so as to close the opening; forming a second metalized via through the third circuit layer and the third adhesive layer, the second metalized via electrically connecting another of the two first circuit layers of the cavity layer and the third circuit layer; and mounting a second electronic component on the third circuit layer such that the second electronic component can be electrically connected to the third circuit layer.

16. The method of claim 12, further comprising mounting a second electronic component over the opening such that the third electronic component can be electrically connected to another of the two first circuit layers of the cavity layer.

17. The method of claim 16, further comprising filling an empty space in the opening with an electrically insulating material.

18. The method of claim 12, wherein bonding the first non-cavity layer and forming the first metalized blind via are performed in inverse order.

19. The method of claim 12, wherein the cavity layer further comprises additional first circuit layers and additional adhesive layers, wherein the additional first circuit layers are stacked between the two first circuit layers with the additional adhesive layers interposed therebetween.

20. A multilayer laminate package comprising:
a cavity layer comprising a plurality of first circuit layers, and at least one first adhesive layer, the at least one first adhesive layer bonding together the first circuit layers so as to form a stack having a height;
an opening which is formed in the cavity layer so as to penetrate through the stack of first circuit layers;
a first non-cavity layer comprising a second adhesive layer and a second circuit layer, the first non-cavity layer being bonded to a surface of the cavity layer by the second adhesive layer so as to close one side of the opening and such that a portion of the second circuit layer is exposed through the opening;
a first electronic component that has a height and is mounted in the opening and on the first non-cavity layer, and that is electrically connected to the portion of the second circuit layer exposed through the first opening; and
a metalized blind via that is formed through the first non-cavity layer and electrically connects the second circuit layer to one of the first circuit layers.

21. The multilayer laminate package of claim 20, wherein the height of the electronic component is greater than the height of the stack.

22. The multilayer laminate package of claim 20, wherein the height of the electronic component is less than or equal to the height of the stack.

23. The multilayer laminate package of claim 1, wherein the first electric component is directly connected to the portion of the second circuit layer that is exposed through the first opening.

* * * * *